(12) United States Patent
Arai

(10) Patent No.: US 7,675,111 B2
(45) Date of Patent: Mar. 9, 2010

(54) SEMICONDUCTOR DEVICE INCLUDING DIFFUSION LAYER FORMED IN DRIFT REGION DISPOSED APART FROM BASE REGION

(75) Inventor: Takao Arai, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 846 days.

(21) Appl. No.: 11/455,173

(22) Filed: Jun. 19, 2006

(65) Prior Publication Data
US 2006/0289930 A1    Dec. 28, 2006

(30) Foreign Application Priority Data
Jun. 24, 2005  (JP)  ............................. 2005-185698

(51) Int. Cl.
*H01L 29/94* (2006.01)
(52) U.S. Cl. .................... 257/330; 257/331; 257/332; 257/334; 257/E29.201; 257/E29.26
(58) Field of Classification Search ............... 257/330, 257/331, 332, 334, E27.125, E29.201, E29.26
See application file for complete search history.

(56) References Cited
U.S. PATENT DOCUMENTS
6,037,632 A    3/2000   Omura et al.
6,639,278 B2   10/2003  Sumida et al.
2002/0195657 A1 * 12/2002 Williams et al. ............ 257/332
2003/0213993 A1   11/2003  Spring et al.

FOREIGN PATENT DOCUMENTS
JP  2003-174166   6/2003
JP  2004-95954    3/2004

* cited by examiner

*Primary Examiner*—Tan N Tran
(74) *Attorney, Agent, or Firm*—McGinn IP Law Group, PLLC

(57) ABSTRACT

Aiming at providing a semiconductor device capable of reducing the ON-resistance when voltage smaller than a predetermined value is applied to the base region and the drift region, and capable of increasing the ON-resistance so as to prevent thermal fracture when the voltage is not smaller than the predetermined value, and at providing a method of fabricating such semiconductor device, a P-type diffusion layer 7 is formed in an N-type drift region 2 of a semiconductor device 100, as being apart from a base region 5, wherein the diffusion layer 7 is formed in a region partitioned by lines L each extending from each of the intersections of the boundary B, between the drift region 2 and a base area 5A of the base region 5, and the side faces of a trench 15 surrounding the base area 5A of the base region 5, towards the bottom plane of the drift region 2 right under the base area 5A, while keeping an angle θ2 of 50° between the lines L and the boundary B.

3 Claims, 14 Drawing Sheets

SEMICONDUCTOR DEVICE INCLUDING DIFFUSION LAYER FORMED IN DRIFT REGION DISPOSED APART FROM BASE REGION

This application is based on Japanese patent application No. 2005-185698 the content of which is incorporated hereinto by reference.

BACKGROUND

1. Technical Field

The present invention relates to a semiconductor device and a method of fabricating the same.

2. Related Art

Double-diffusion field effect transistor for driving load has conventionally been known. As an example of the double-diffusion field effect transistor, there has been adopted a semiconductor device such as shown in FIG. 13 (see Japanese Laid-Open Patent Publication "Tokkai" No. 2003-174166). FIG. 13 is a sectional view of a semiconductor device 500 which includes an N-type semiconductor substrate 1, an N-type drift region 2 disposed on the semiconductor substrate 1, a P-type base region 5 disposed on the drift region 2, a gate electrode 4, a source electrode 9, a drain electrode 10, and an interlayer insulating film 8.

The gate electrode 4 is disposed in a trench 15 which penetrates the base region 5 to reach the drift region 2.

There has been known also a semiconductor device as shown in Japanese Laid-Open Patent Publication "Tokkai" No. 2004-95954, as a double-diffusion field effect transistor. FIG. 14 is a sectional view of the semiconductor device as shown in "Tokkai" No. 2004-95954, wherein a semiconductor device 600 has a P-type region 601 held between an N-type region 603 which corresponds to the drift region on the semiconductor substrate 1, and an N-type region 602 under the base region 5.

It is to be noted that FIGS. 13 and 14 show only two cells, but a practical semiconductor device has several thousands or more cells formed therein.

The conventional technique described in Japanese Laid-Open Patent Publication "Tokkai" No. 2003-174166, however, still has room for improvement in the aspects below.

The semiconductor device 500 adopts a trench gate structure having the gate electrode disposed in the trench 15 which penetrates the base region 5 to reach the drift region 2, so that the ON-resistance per unit area can be lowered. The semiconductor device having a small ON-resistance per unit area allows a large current to flow therethrough per unit area, but this results in generation of a large energy of heat per unit area when any abnormality such as short-circuiting of the load occurs. The semiconductor device is therefore likely to cause thermal fracture.

On the other hand, a semiconductor device 600 as shown in Japanese Laid-Open Patent Publication No. 2004-95954 has a P-type region 601 provided therein, for the purpose of depleting the periphery of the trench 15 having the gate electrode 4 disposed therein, so as to lower parasitic capacitance of the periphery of the trench 15. The P-type region 601 is configured as covering a region below the bottom of the trench 15, and thereby the width of a current path directed from the N-type region 603 to the base region 5 is considerably narrowed by the P-type region 601. This sort of semiconductor device 600 has the width of current path considerably narrowed not only in case of abnormality such as short-circuiting of the load, but also in the normal operation, always showing a large ON-resistance.

Although Japanese Laid-Open Patent Publication "Tokkai" 2004-95954 describes that increase in the ON-resistance ascribable to the P-type region 601 is avoidable because a path for the channel current is ensured as indicated by arrow Y, but it is understood that the ON-resistance increases to a large degree as compared with that of the semiconductor device 500.

SUMMARY OF THE INVENTION

According to the present invention, there is provided a semiconductor device which comprises a first-conductivity-type drift region; a second-conductivity-type base region formed on the surficial portion of the drift region; a gate electrode disposed in a trench which extends over the surface of the base region, and penetrates the base region to reach the drift region; and a first-conductivity-type source region formed in the base region, the base region including a base area partitioned by the trench, and the drift region having a second-conductivity-type diffusion layer formed therein, as being disposed apart from the base region, wherein in a section taken in one direction normal to the direction of extension of the trench, the base area is surrounded by the trench, and the diffusion layer is not formed in a region except a region partitioned by a pair of lines each extending from each of the intersections of the boundary, between the drift region and the base area, and the side faces of the trench surrounding the base area, towards the bottom plane of the drift region right under the base area, inclined at 50° away from the boundary, and by the boundary.

According to the present invention, the diffusion layer is formed in a region partitioned by a pair of lines each extending from each of the intersections of the boundary, between the drift region and the base area, and the side faces of the trench surrounding the base area, towards the bottom plane of the drift region right under the base area, inclined at 50° away from the boundary, and by the boundary.

More specifically, the diffusion layer in the present invention is formed in a non-conductive region which is supposed to hardly allow current to flow therethrough from the drift region to the base region. The diffusion layer, therefore, never narrows the current path. In addition, the thickness of a depletion layer formed by the diffusion layer and the drift region is small in the normal state wherein voltage applied between the base region and the drift region is lower than a predetermined value, so that the depletion layer is supposed to be not causative of narrowing of the current path due to spreading out from the non-conductive region. The present invention can, therefore, ensure a large width of the current path from the drift region to the base region in the normal state, and can lower the ON-resistance.

On the other hand, in the abnormal state wherein the voltage applied between the base region and the drift region becomes not lower than the predetermined value, the depletion layer formed by the base region and the drift region reaches a depletion layer formed by the diffusion layer and the drift region. The depletion layer formed by the diffusion layer and the drift region expands as the voltage rises, and spreads outwardly from the non-conductive region (that is, the region partitioned by the above-described lines and the boundary). The width of the current path can be narrowed by such expanding depletion layer. As a consequence, the ON-resistance increases, and the semiconductor device is successfully prevented from being thermally fractured.

According to the present invention, there is provided also a method of fabricating a semiconductor device which includes forming a first-conductivity-type semiconductor layer; forming a trench in the semiconductor layer, and further forming a gate electrode in the trench; implanting an impurity into the upper portion of the semiconductor layer to thereby form a second-conductivity-type base region, while leaving the lower portion of the semiconductor layer under the base region as a drift region; and forming a first-conductivity-type source region in the base region, wherein in a stage posterior to the formation of the base region, an implantation energy is set to 500 keV or above, to thereby form a second-conductivity-type diffusion layer in the drift region by the ion implantation process.

The diffusion layer in the present invention is formed posterior to a step of forming the base region, so that the diffusion layer is successfully prevented from being affected by the annealing which is carried out for forming the base region.

Moreover, the implantation energy under which the diffusion layer is formed by the ion implantation process is set to 500 keV or more, so that the diffusion layer can be formed in the drift region exactly as being apart from the base region. The implantation energy less than 500 keV may undesirably result in formation of the diffusion layer only in the surficial portion of the drift region, so that the diffusion layer may come into contact with the base region. The implantation energy herein is more preferably set to 1,000 keV or above.

In the present invention, it is also allowable to form the diffusion layer after the base region and the source region are formed, or to form the diffusion layer between the steps of forming the base region and of forming the source region. Among others, the diffusion layer is preferably formed after the base region and the source region are formed. Formation of the diffusion layer posterior to formation of the base region and the source region successfully prevents the diffusion layer from being affected not only by annealing carried out for forming the base region, but also by annealing carried out for forming the source region.

The present invention is successful in providing a semiconductor device capable of lowering the ON-resistance without narrowing the current path when voltage applied between the base region and the drift region is lower than a predetermined value, and of increasing the ON resistance by narrowing the current path to thereby prevent thermal fracture of the semiconductor device when voltage applied between the base region and the drift region is not lower than the predetermined value, and a method of fabricating such semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
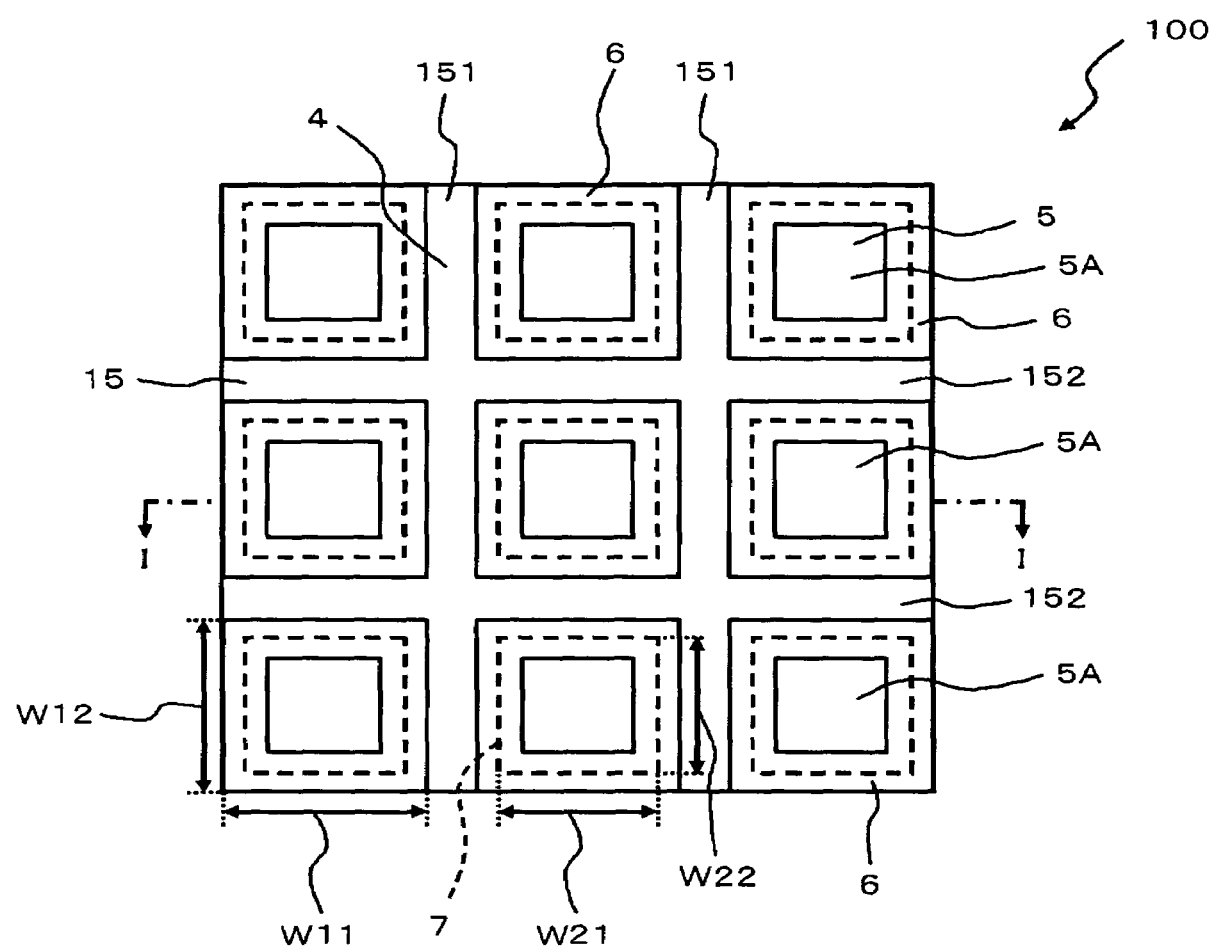
FIG. 1 is a plan view showing a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Paragraphs below will describe embodiments of the present invention, referring to the attached drawings. It is to be noted that any similar constituents will be given with similar reference numerals, so as to omit explanations therefor on occasions.

First Embodiment

A first embodiment of the present invention will be detailed referring to FIGS. 1 to 11.

FIG. 1 is a plan view showing a semiconductor device according to the first embodiment of the present invention.

Figure 2:
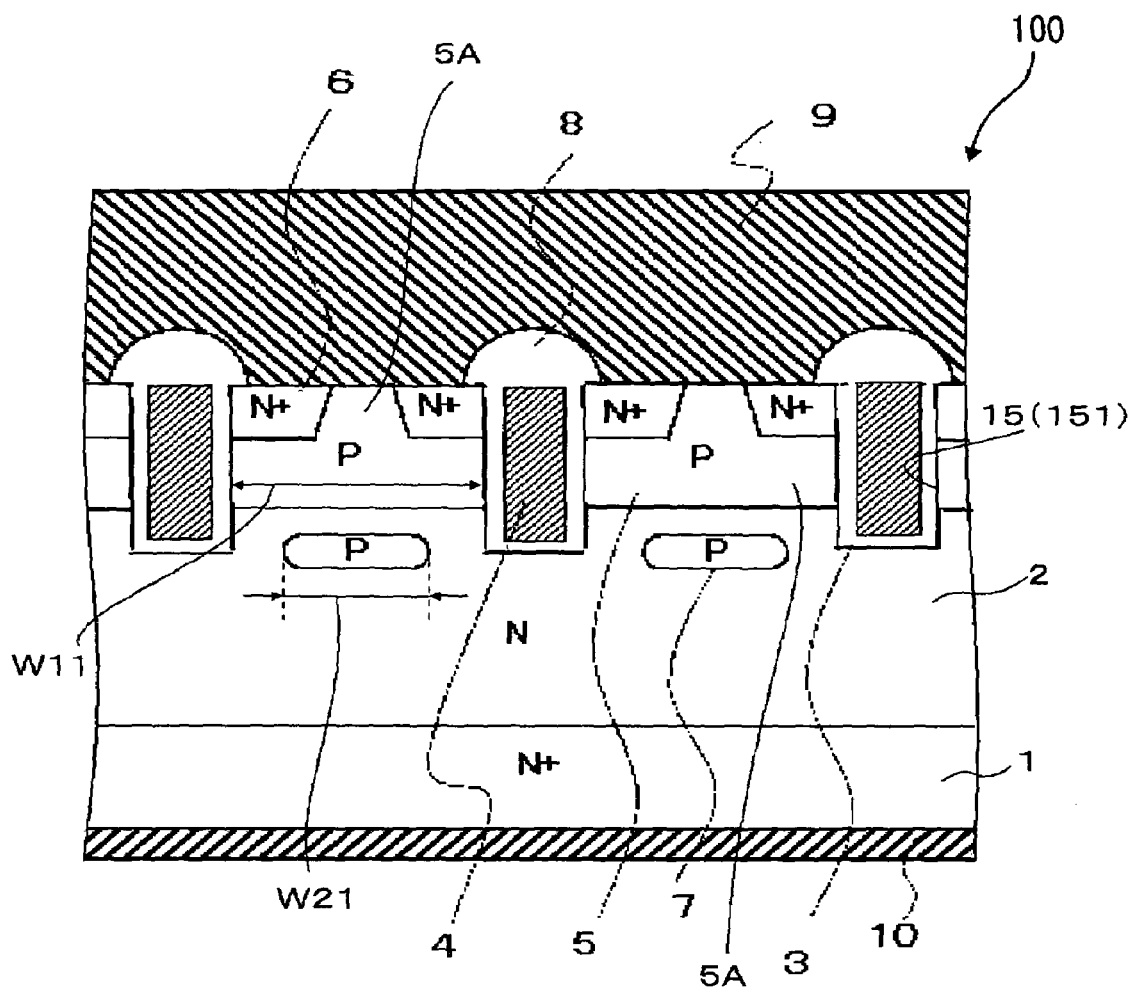
FIG. 2 is a sectional view showing the semiconductor device of the first embodiment.

FIG. 2 is a sectional view of the semiconductor device taken along the I-I direction in FIG. 1.

It is to be noted that a source electrode 9 and an inter-layer insulating film 8 described later are omitted in FIG. 1.

A semiconductor device 100 of this embodiment is a field effect transistor having a buried-gate structure.

The semiconductor device 100 has, as shown in FIGS. 1 and 2, a semiconductor substrate 1, a drift region 2 formed on the semiconductor substrate 1, a base region 5 formed on the surficial portion of the drift region 2, a gate oxide film 3 formed on the side faces and bottom surface of a trench 15 which extends over the surface of the base region 5 and penetrates the base region 5 to reach the drift region 2, gate electrodes 4 buried in the trench 15, source regions 6 formed in the surficial portion of the base region 5, diffusion layers 7 formed in the drift region 2, an inter-layer insulating film 8 formed on the gate electrodes 4, a source electrode 9 formed so as to cover the source regions 6, and a drain electrode 10 formed on the back surface (surface having no drift region 2 formed thereon) of the semiconductor substrate 1.

It is assumed now that the semiconductor substrate 1 is $N^+$-type (first conductivity type), the drift region 2 is N-type (first conductivity type), the source regions 6 are $N^+$-type (first conductivity type), and the base region 5 and the diffusion layer 7 are P-type (second conductivity type).

As shown in FIG. 1, the trench 15 is configured by longitudinal trenches 151 and transverse trenches 152 cross normal to each other, forming a lattice.

The trench 15 penetrates the base region 5, so that the base region 5 is partitioned into a plurality of base area 5A. In other words, the base region 5 is composed of a plurality of base areas 5A. Each base area 5A is held between a pair of longitudinal trenches 151, and also by a pair of transverse trenches 152. Each base area 5A has a rectangular geometry, and is equalized in the size and geometry.

As shown in FIGS. 1 and 2, a plurality of diffusion layers 7 are formed in the drift region 2, as being apart from the base region 5, and in adjacent to the longitudinal trenches 151 and the transverse trenches 152.

Each of the plurality of diffusion layers 7 is disposed in a region right under each of the base areas 5A of the base region 5, so as not to extend beyond the region right under the base area 5A.

As shown in FIG. 2, in a section taken along the I-I direction in FIG. 1 (a section in one direction normal to the direction of extension of the longitudinal trenches 151), the base area 5A is disposed as being held between the longitudinal trenches 151, and the width W21 of the diffusion layer 7 is set smaller than the width W11 of a space between the longitudinal trenches 151 holding the base area 5A.

Although not shown in the drawing, the base area 5A is held between the transverse trenches 152 also in a section normal to the I-I direction (section in other direction normal to the direction of extension of the transverse trenches 152), and the width W22 of the diffusion layer 7 is set smaller than the width W12 of a space between the transverse trenches 152 holding the base area 5A (see FIG. 1).

Figure 4:
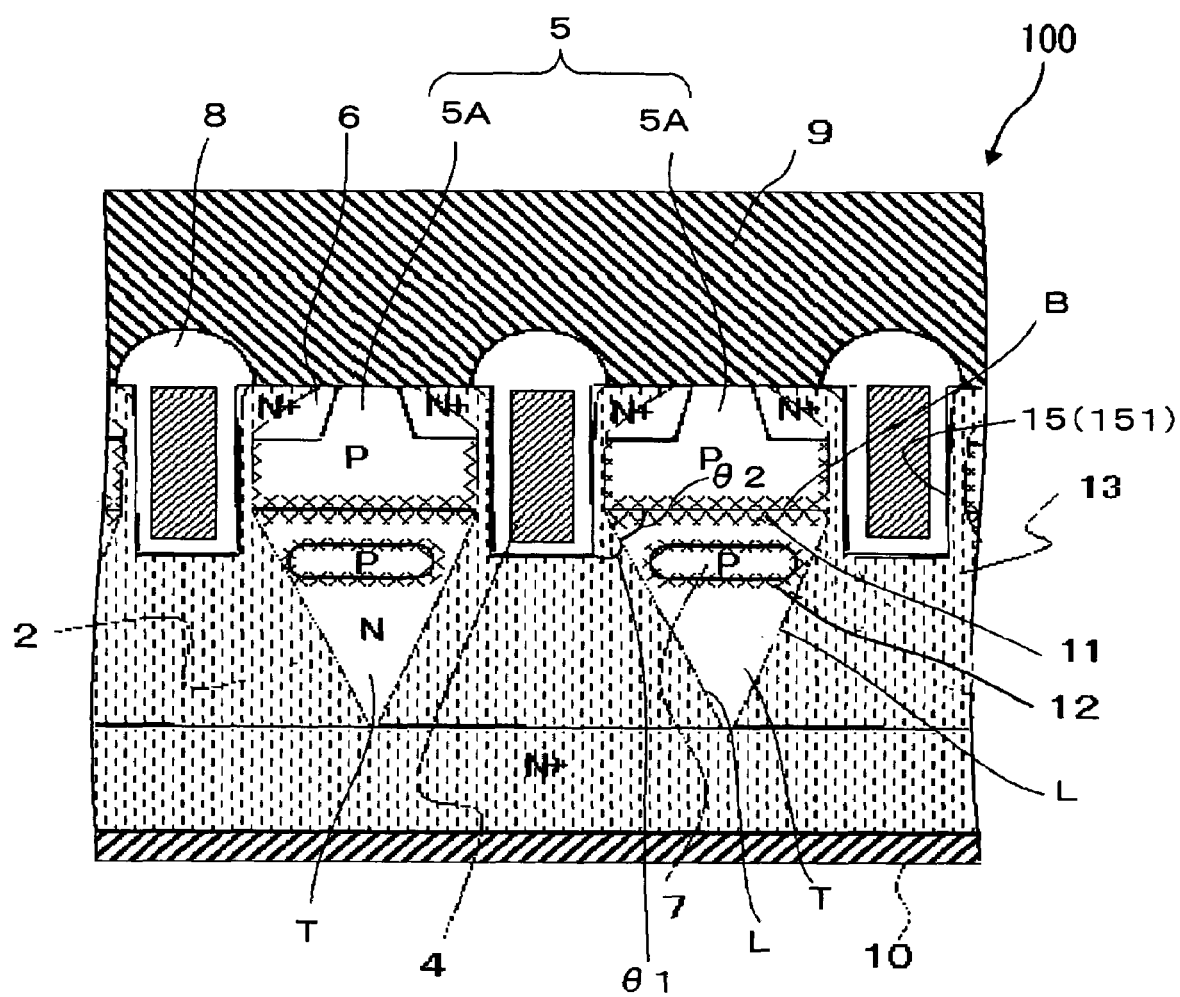
FIGS. 4 and 5 are sectional views explaining operational states of the semiconductor device of the first embodiment.

In the region right under each base area 5A of the base region 5, there is formed a non-conductive region T hardly allowing current to flow therethrough from the drift region 2 towards the base region 5 (see FIG. 4). The diffusion layer 7 is disposed in this region T. The diffusion layer 7 is not formed in a region except this region T.

FIG. 4 is a sectional view taken along the I-I direction, and the non-conductive region T is a region partitioned by lines L each extending from each of the intersections of the boundary B, between the drift region 2 and the base area 5A of the base region 5, and the side faces of the trench 15, towards the bottom plane of the drift region 2 right under the base area 5A of the base region 5, and by the boundary B.

The bottom plane of the drift region 2 herein means a plane which resides on the semiconductor substrate 1 side. The region right under the base area 5A means a region held between a pair of extended surfaces which are assumed as extension of the opposing surfaces of the trench 15 holding the base area 5A in between perpendicularly downward to the bottom plane of the drift region 2.

The angle θ2 between the lines L and the boundary B may be 50°, more preferably θ2=45° to 50°, and still more preferably θ2=45°.

By forming the diffusion layer 7 in a region partitioned by the lines L and the boundary B forming an angle θ2 of 45°, it is made possible to more exactly prevent the diffusion layer 7 and the depletion layer 12 (described later) from contacting with a current path 13 (described later) in the normal state.

Although not illustrated herein in the drawing, the diffusion layer 7 is disposed, also in a section normal to the I-I direction (section in other direction normal to the direction of extension of the transverse trenches 152), in a region partitioned by the lines each extending from each of the intersections of the boundary, between the drift region 2 and the base area 5A, and the side faces of the transverse trenches 152, towards the bottom plane of the drift region 2 right under the base area 5A of the base region 5, and the boundary. Also in this case, angle formed between the lines and the boundary may be 50°, and preferably 45°.

The source region 6 is disposed in adjacent to the edge of the trench 15, so that the trench 15 is held between a pair of source regions 6.

The source electrode 9 is provided so as to cover the surface of the source region 6, the surface of the base region 5 exposed between a pair of source regions 6, and the surface of the inter-layer insulating film 8.

Next, an equivalent circuit of the semiconductor device 100 will be explained referring to FIG. 3.

Figure 3:
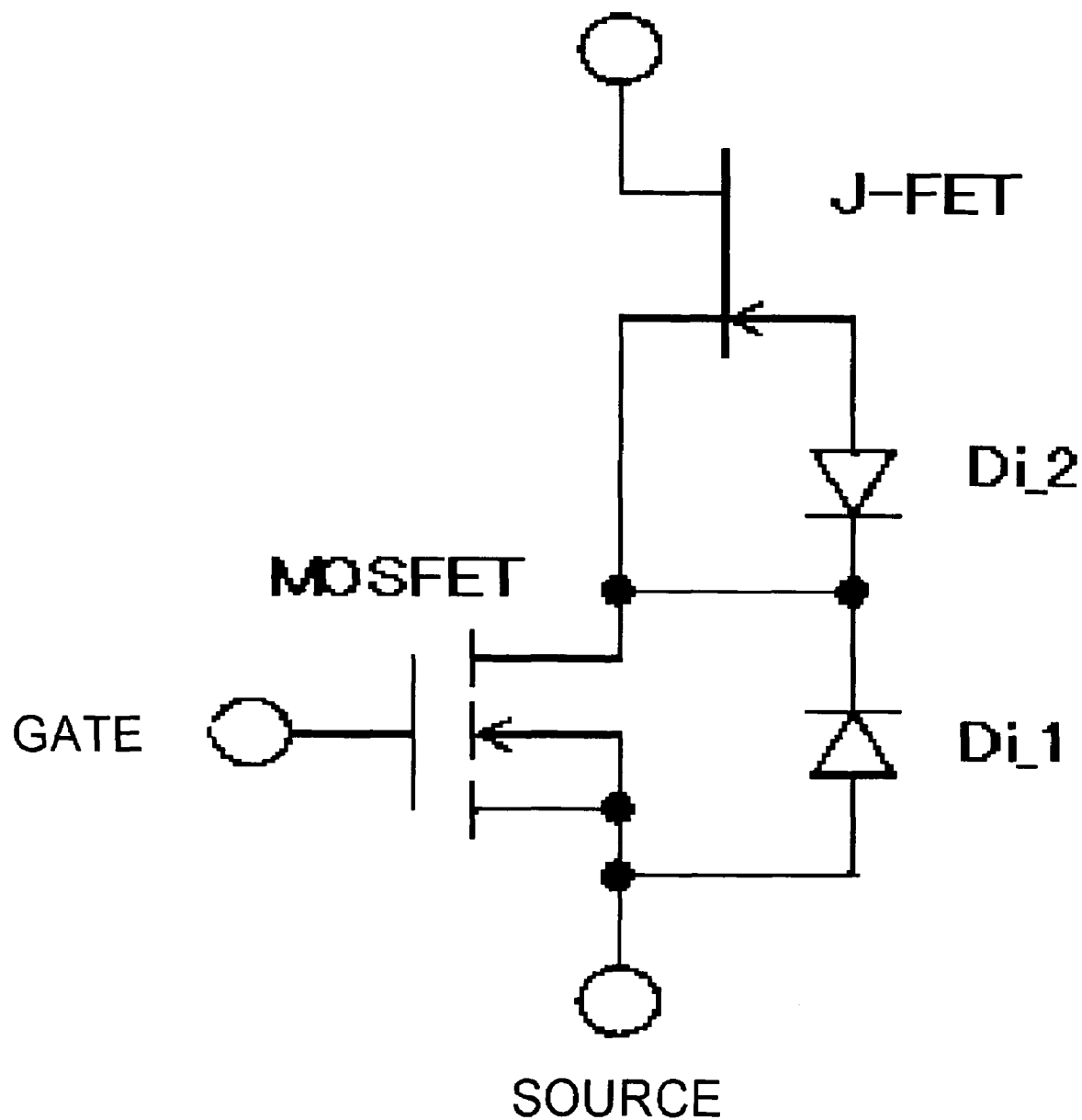
FIG. 3 is a drawing showing an equivalent circuit of the semiconductor device of the first embodiment.

A diode Di_1 in FIG. 3 corresponds to a PN junction between the P-type base region 5 and the N-type drift region 2 shown in FIG. 2.

A diode Di_2 in FIG. 3 corresponds to a PN junction between the P-type diffusion layer 7 and the N-type drift region 2 in FIG. 2.

The gate of the junction field effect transistor J-FET in FIG. 3 corresponds to the P-type diffusion layer 7 shown in FIG. 2, and the drain and the source of the junction field effect transistor J-FET correspond to the N-type drift region 2 shown in FIG. 2. In other words, a portion held between a pair of diffusion layers 7 in FIG. 2 corresponds to a channel region.

The gate of a field effect transistor MOSFET in FIG. 3 corresponds to the gate electrode 4 in FIG. 2, the drain corresponds to the drift region 2, and the source corresponds to the source electrode 9.

Next paragraphs will describe operations of the semiconductor device 100.

Figure 5:
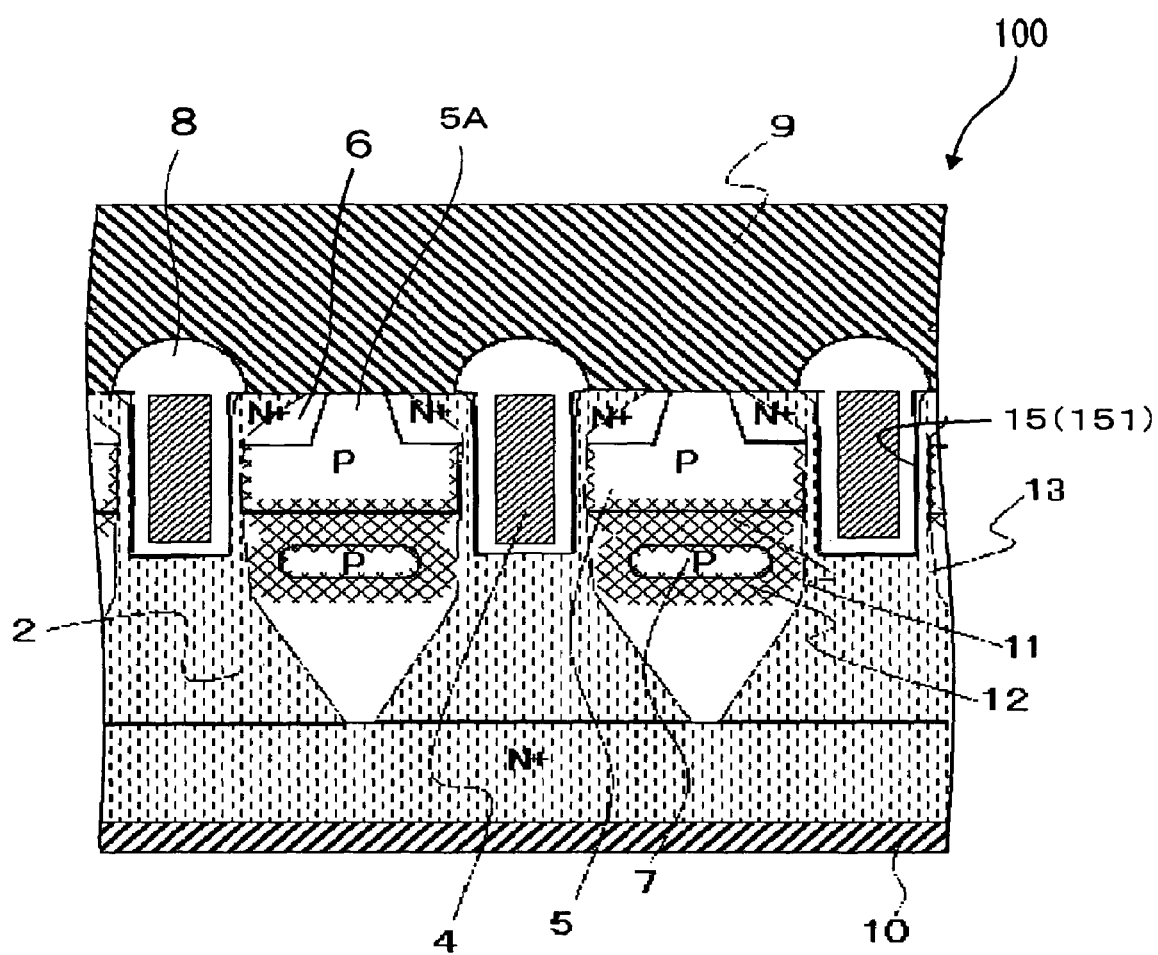

FIGS. 4 and 5 are drawings explaining operational states of the semiconductor device 100.

As shown in FIG. 4, semiconductor device 100 is turned ON by applying voltage between the gate electrode 4 and the source electrode 9. For the case where voltage applied between the drain electrode 10 and the source electrode 9 (drain voltage) is small, the depletion layer 11 ascribable to the PN junction between the P-type base region 5 and the N-type drift region 2 does not reach the depletion layer 12 ascribable to the PN junction between the P-type diffusion layer 7 and the N-type drift region 2.

Potential of the diffusion layer 7 in this case is almost equal to potential of the drain electrode 10, and the depletion layer 12 ascribable to the PN junction between the P-type diffusion layer 7 and the N-type drift region 2 will have a width corresponded to the intrinsic potential Vbi.

A path of current (drain current) which flows in this case is expressed as current path 13 (current flows from the drain electrode 10 to the source electrode 9 along a portion indicated by the dotted line in FIG. 4. In other words, the portion indicated by the dotted line in FIG. 4 is the current path 13).

In this embodiment, the angle θ1 of the current path 13 away from the boundary B between the drift region 2 and the base region 5 is approximately 40°, and the depletion layer 12 ascribable to the PN junction between the diffusion layer 7 and the drift region 2 does not come into contact with the current path 13. The depletion layer 12 ascribable to the PN junction between the diffusion layer 7 and the drift region 2 does not interfere the current flow, so that the semiconductor device allows the same amount of current to flow therethrough as in the semiconductor device 500 having no diffusion layer 7 formed therein.

In other words, the ON-resistance [(drain voltage)/(drain current)] of the semiconductor device 100 of this embodiment and the ON-resistance of the conventional semiconductor device 500 are at the same level.

When the voltage (drain voltage) applied between the drain electrode 10 and the source electrode 9 increases, the depletion layer 11 spreading due to the PN junction between the P-type base region 5 and the N-type drift region 2 reaches the depletion layer 12 as shown in FIG. 5, and the depletion layer 11 and the depletion layer 12 are fused.

Assuming now the voltage of the drain electrode 10 causing the fusion of the depletion layer 11 and the depletion layer 12 as VP, the potential of the diffusion layer 7 is fixed to VP even if the voltage (drain voltage) applied to the drain electrode 10 is further raised, resulting in reverse biased state of the PN junction between the P-type diffusion layer 7 and the N-type drift region 2. The depletion layer 12 consequently expands as the voltage applied to the drain electrode 10 increases.

Thus expanded depletion layer 12 narrows the current path 13, and suppresses the amount of current (drain current) (in FIG. 5, a portion indicated by the dotted line represents the current path along which the current flows).

In other words, the junction field effect transistor J-FET shown in FIG. 3 operates to suppress the current.

Figure 6:
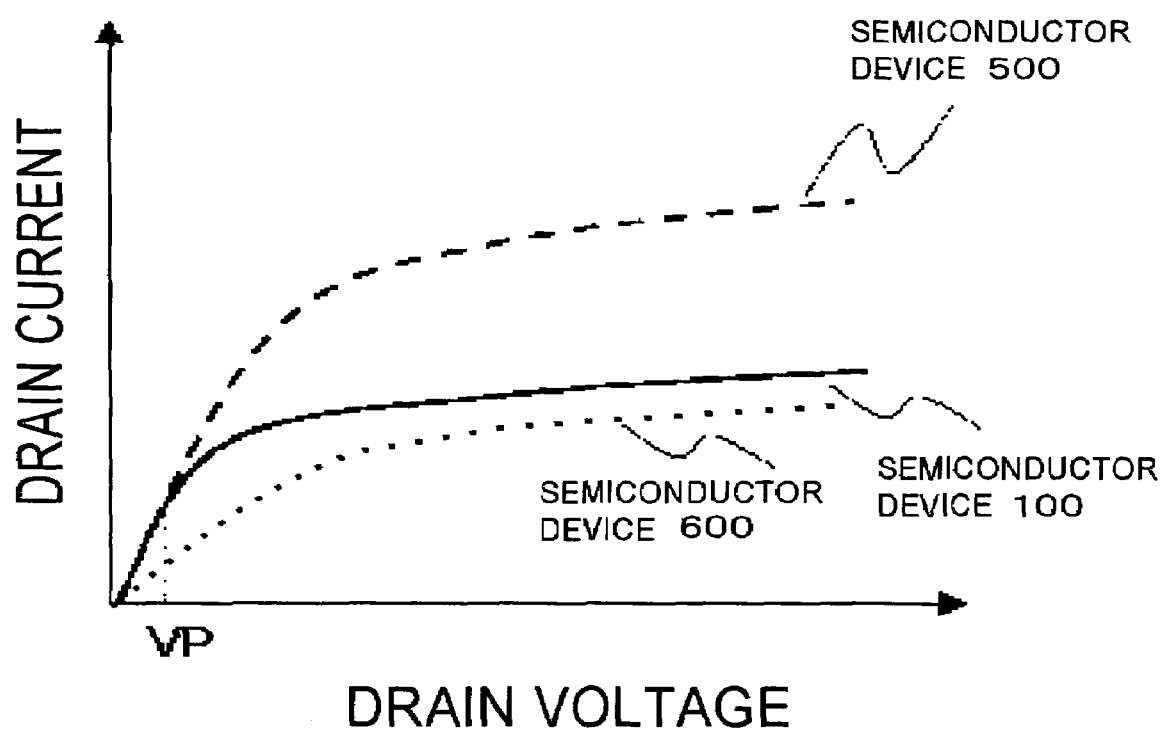
FIG. 6 is a drawing showing drain voltage-drain current characteristic of the semiconductor device of the first embodiment.

FIG. 6 is a drawing showing the voltage (drain voltage)-current (drain current) characteristics. In the period before the drain voltage reaches VP (normal state), no difference can be found in the amount of drain current between the conventional semiconductor device 500 having no diffusion layer 7 formed therein and the semiconductor device 100 (θ2=50°) of this embodiment.

On the other hand, when the drain voltage reaches and exceeds VP (abnormal state), the amount of drain current in the semiconductor device 100 of this embodiment becomes smaller than the amount of drain current in the conventional semiconductor device 500.

It is found that the amount of drain current in the conventional semiconductor device 600 is extremely small in the normal state showing the drain voltage smaller than VP, indicating that the current path is narrowed to a considerable degree.

The voltage applied to the semiconductor device under load operation is normally 1 V or below, so that VP is preferably set to 1 V. By virtue of this setting, power consumption of the semiconductor device 100 under normal load operation is equivalent to that of the conventional semiconductor device 500, but the power consumption (product of voltage and current in a state of high drain voltage shown in FIG. 6) of the semiconductor device 100 under abnormality such as short-circuiting of the load becomes smaller than that of the conventional semiconductor device 500, so that heat generation can be suppressed.

Setting of the voltage VP is adjustable based on the distance between the base region 5 and the diffusion layer 7, wherein smaller distance between the base region 5 and the diffusion layer 7 gives smaller VP.

Increase in the voltage (drain voltage) applied between the drain electrode 10 and the source electrode 9 up to VP or above causes reverse biasing of the PN junction between the P-type diffusion layer 7 and the N-type drift region 2 to thereby spread the depletion layer 12, wherein the depletion layer 12 spreads also into the diffusion layer 7. Even under the same reverse biasing condition, the width of a portion of the depletion layer 12 formed in the drift region 2 differs depending on a gradient of impurity concentration in the diffusion layer 7. Larger gradient of impurity concentration of the diffusion layer 7 gives larger width of the portion of the depletion layer 12 formed in the drift region 2, and gives a larger effect of suppressing current (drain current).

In view of raising the gradient of impurity concentration of the diffusion layer 7, it is preferable to reduce the number of times the diffusion layer 7 is annealed.

Paragraphs below will describe a method of fabricating the semiconductor device 100, referring to FIGS. 7 to 11 showing process steps.

Figure 7:
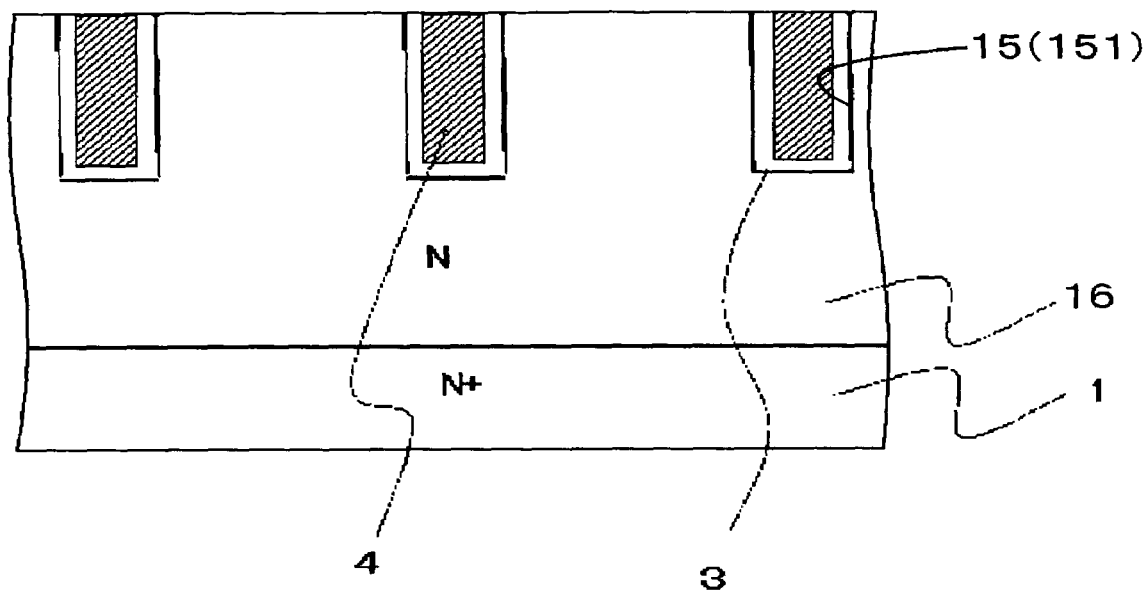
FIGS. 7 to 11 are sectional views showing process steps of fabricating the semiconductor device according to the first embodiment.

First, as shown in FIG. 7, an N-type semiconductor layer 16 is epitaxially grown on the N-type semiconductor substrate 1 having a high impurity concentration. The semiconductor layer 16 later serves as the N-type drift region 2 and the base region 5 formed on the surficial portion of the drift region 2.

Next, the semiconductor layer 16 is selectively etched based on a photolithographic technique, to thereby form the trench 15. The gate oxide film 3 is then formed by thermal oxidation on the side faces and the bottom of the trench 15.

Figure 8:
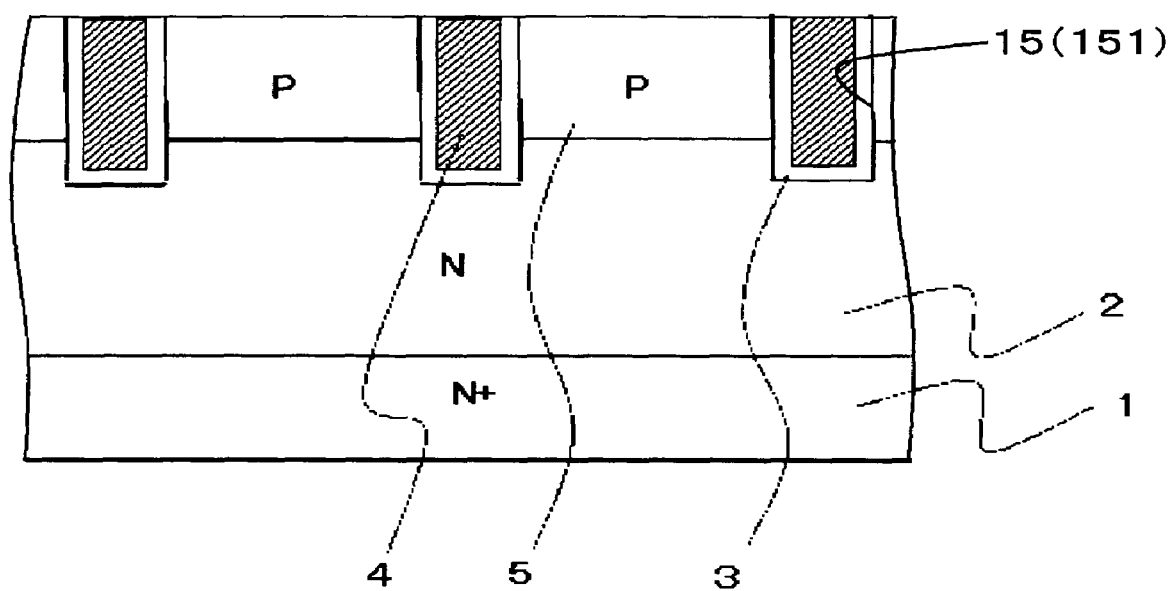

A polysilicon layer is then formed by the CVD (chemical vapor deposition) process in the trench 15 and over the surface of the semiconductor layer 16. Thereafter, the polysilicon layer is removed by the etch-back process so as to leave the layer only in the trench 15, and to remove the other portion of the layer. The polysilicon layer left in the trench 15 later serves as the gate electrode 4. Next, as shown in FIG. 8, boron ion is implanted in a self-aligned manner using the gate electrode 4 as a mask, to thereby form the base region 5 in the surficial portion of the semiconductor layer 16. The lower portion of the base region 5 later serves as the drift region 2.

Figure 9:
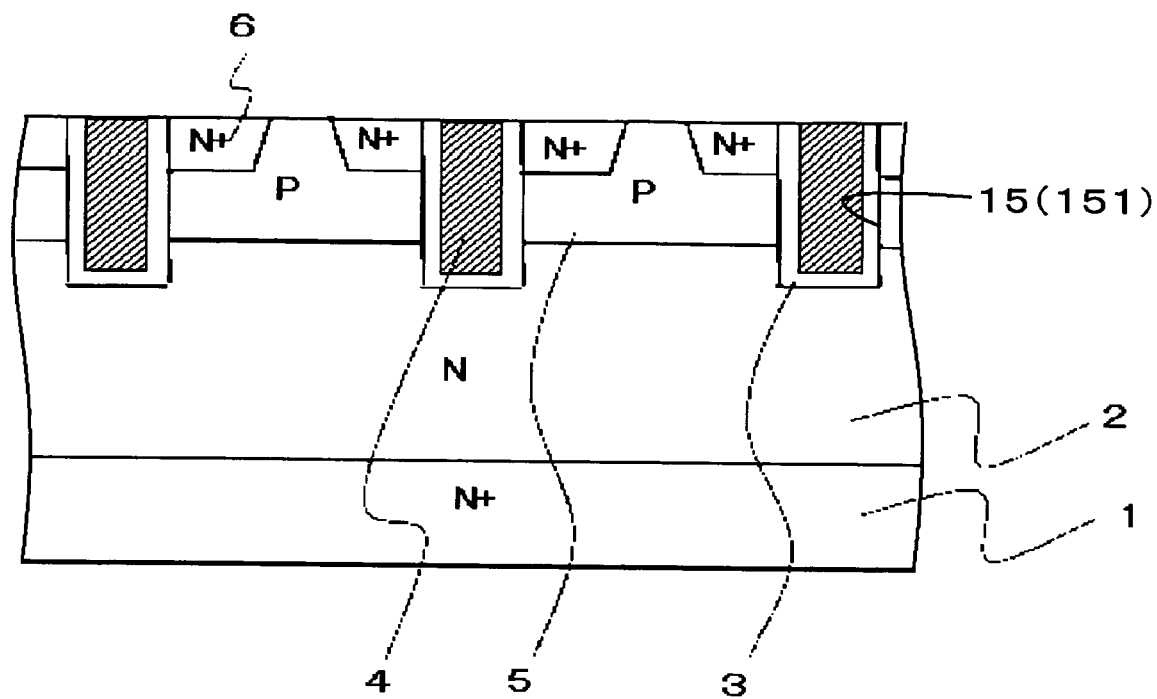

Next, arsenic ion is implanted through a photoresist mask based on a photolithographic technique. Thereafter, annealing is carried out so as to form the source region 6, as shown in FIG. 9.

Figure 10:
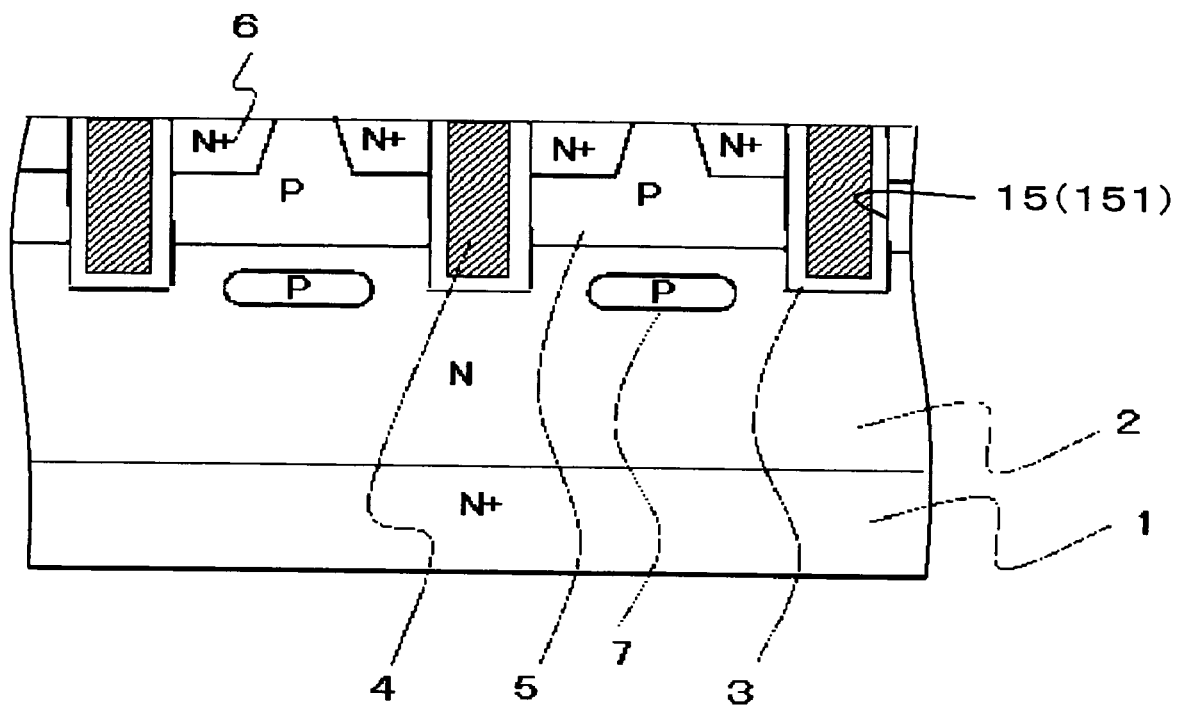

Next, boron ion is implanted through a photoresist mask based on a photolithographic technique, under a relatively high implantation energy. Thereafter, annealing is carried out so as to form the diffusion layer, as shown in FIG. 10. The ion implantation energy herein is preferably adjusted to 500 keV or above.

Figure 11:
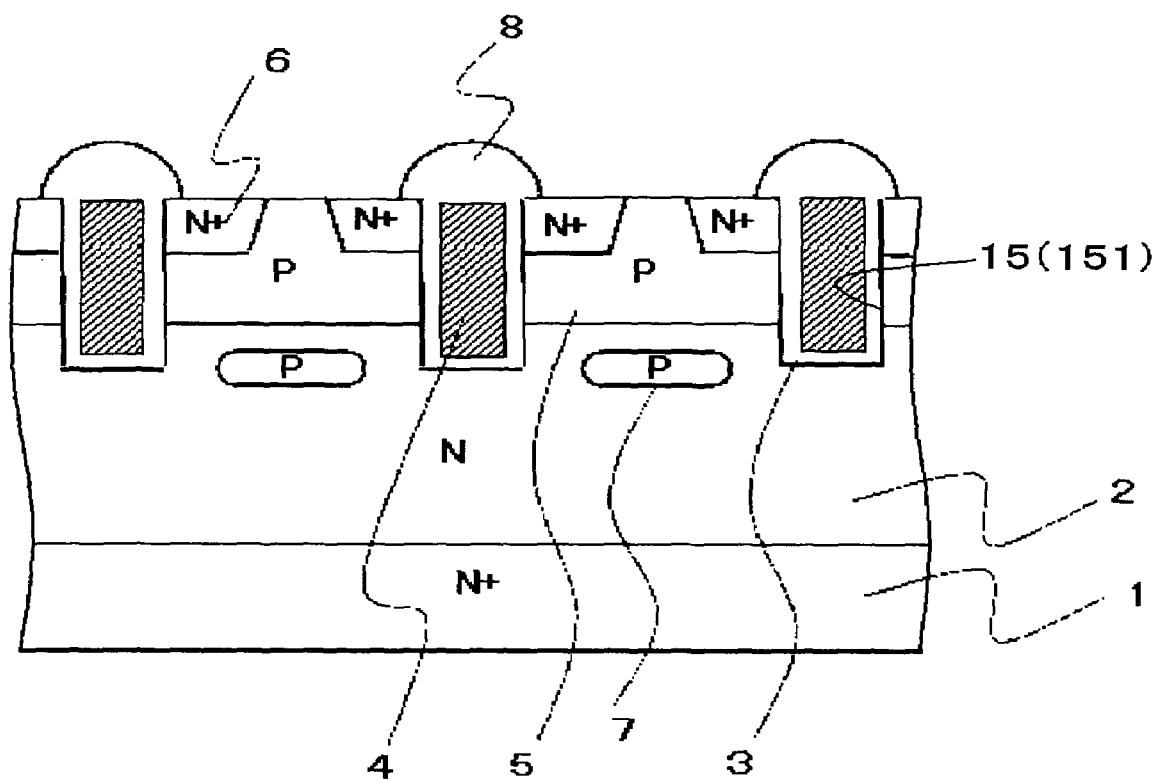

A borophosphosilicate glass (BPSG) layer is then grown by the CVD process, and selectively etched based on a photolithographic technique, to thereby form the interlayer insulating film 8, as shown in FIG. 11.

Thereafter, an aluminum film is formed by sputtering to thereby form the source electrode 9 as shown in FIG. 2. On the other hand, a silver film is deposited by vacuum evaporation on the back surface of the semiconductor substrate 1, to thereby form the drain electrode 10.

The semiconductor device 100 can be obtained after completion of these process steps.

Assuming now that the impurity concentration of the drift region 2 is $6\times10^{15}$ cm$^{-3}$, and the junction depth of the base region 5 is 0.9 μm, fabrication of the semiconductor device 100 based on the above-described process steps, under conditions for forming the diffusion layer 7 which include a dose of $2\times10^{12}$ cm$^{-2}$, an implantation energy of 1,000 keV, and an annealing at 850° C. for 10 minutes, gives a resultant distance between the base region 5 and the diffusion layer 7 of 0.6 μm, and a voltage VP of approximately 1 V. The drain current under the drain voltage of VP or above can be reduced by 40% as compared with the drain current in the conventional semiconductor device 500.

This embodiment described in the above can raise effects below.

In this embodiment, the diffusion layer 7 is formed in the non-conductive region T hardly allowing current to flow therethrough from the drift region 2 to the base region 5. There is, therefore, no fear of narrowing of the current path 13 due to the diffusion layer 7 in the normal operation. In addition, in the normal operation showing the voltage applied between the base region 5 and the drift region 2 kept as being lower than a predetermined value, it is supposed that the current path 13 would not be narrowed due to depletion layer 12, because the depletion layer 12 formed by the diffusion layer 7 and the drift region 2 is thin. Therefore in the normal operation, the ON-resistance of the semiconductor device 100 of this embodiment is not inferior at all to the ON-resistance of the conventional semiconductor device 500 having no diffusion layer 7 formed therein, and can be realized at a level as low as that of the conventional semiconductor device 500.

On the other hand, under abnormality having the voltage applied between the base region 5 and the drift region 2 rises up to a predetermined value or above, the depletion layer 11 formed by the base region 5 and the drift region 2 reaches the depletion layer 12 formed by the diffusion layer 7 and the drift region 2, so as to expand the depletion layer 12 as the voltage rises. The width of the current path 13 can be narrowed by thus-expanded depletion layer 12. The ON-resistance per unit area consequently increases, the amount of current allowed to flow per unit area is reduced, and thereby thermal fracture of the semiconductor device 100 becomes avoidable.

Moreover, in this embodiment, the width W21 of the diffusion layer 7 is set smaller than the width W11 of the space between the longitudinal trenches 151 holding the base area 5A, and the width W22 of the diffusion layer 7 is set smaller than the width W12 of the space between the transverse trenches 152 holding the base area 5A, so that the drift region 2 is exactly secured between the side faces of the trench 15 and the diffusion layer 7, and thereby the current path is certainly formed. Current is therefore exactly allowed to flow therethrough.

It may otherwise be possible to control the amount of current possibly flowing in case of abnormality by providing a protection circuit to the semiconductor device 500, but a large amount of current undesirably flows through the semiconductor device 500 before the protection circuit starts to operate. Any efforts for completely protecting the semiconductor device 500 by activating the protection circuit before a large current flows therethrough may complicate operation control of the protection circuit.

In contrast to this, the semiconductor device 100 of this embodiment can control current possibly flows under abnormality, so that the operation control of the protection circuit, even if it is provided, can be prevented from being complicated.

In view of widening the portion, formed in the drift region 2 under abnormality, of the depletion layer 12 formed by the drift region 2 and the diffusion layer 7 so as to suppress the flow of current, it is preferable to raise the gradient of impurity concentration in the diffusion layer 7. To raise the gradient of impurity concentration, it is necessary to reduce the number of times the diffusion layer 7 is annealed.

In this embodiment, the diffusion layer 7 is formed after the base region 5 and the source region 6 are formed, so that effects of the annealing for forming the base region 5 and the source region 6 can be excluded.

Adjustment of the implantation energy for forming the diffusion layer 7 by the ion implantation process to 500 keV also makes it possible to exactly form the diffusion layer 7 in the drift region 2.

The implantation energy is more preferably set to 1,000 keV or above.

Second Embodiment

Paragraphs below will describe the second embodiment of the present invention referring to FIG. 12.

Figure 12:
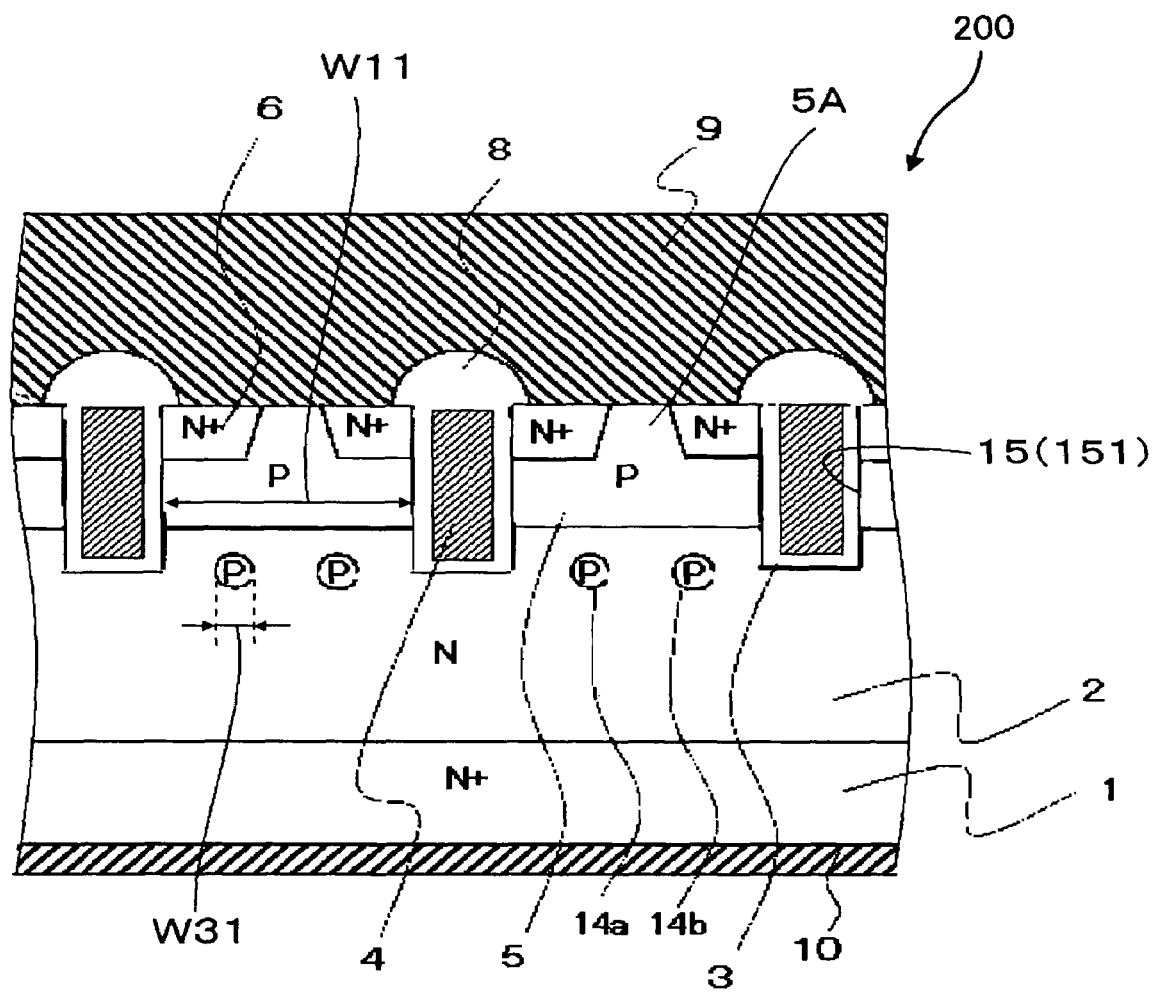
FIG. 12 is a sectional view showing a semiconductor device according to a second embodiment of the present invention.
Figure 13:
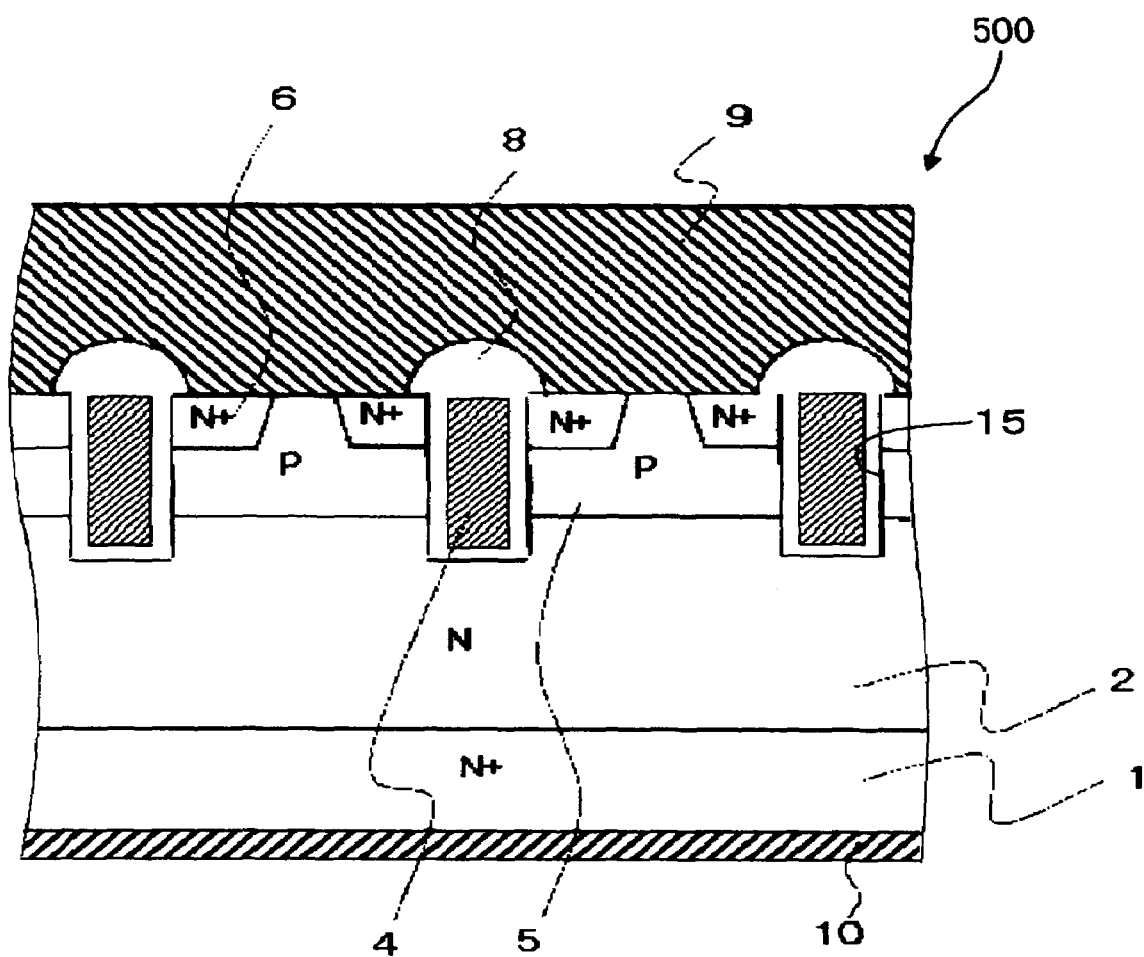
FIG. 13 is a sectional view showing a conventional semiconductor device.
Figure 14:
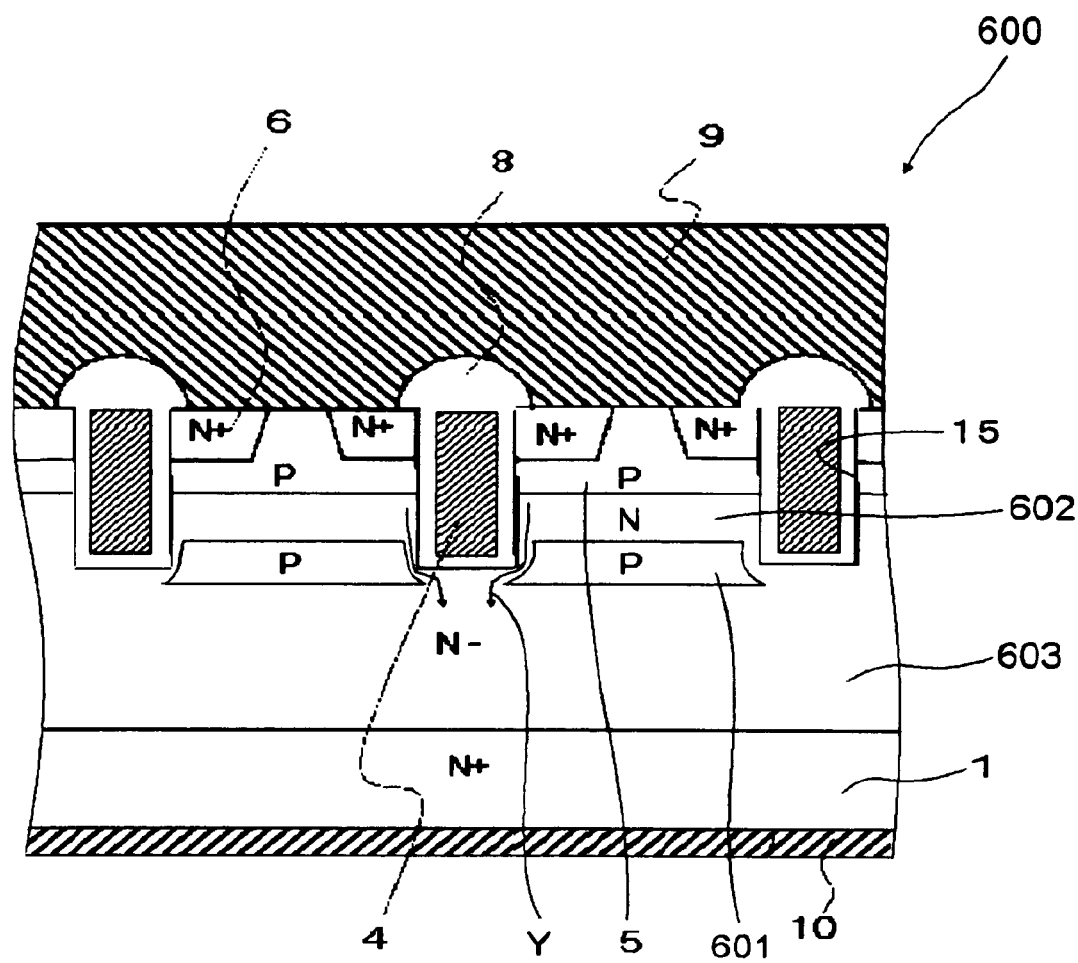
FIG. 14 is a sectional view showing another conventional semiconductor device.

The embodiment described in the above has only a single diffusion layer 7 disposed right under each base area 5A of the base region 5, whereas a semiconductor device 200 of this embodiment has, as shown in FIG. 12, a plurality of diffusion layers disposed right under each base area 5A. In this embodiment, two diffusion layers 14a, 14b are disposed right under each base area 5A. Other aspects are the same as those in the first embodiment.

FIG. 12 is a sectional view taken in the direction normal to the longitudinal direction of the longitudinal trenches 151.

The diffusion layers 14a, 14b are same in the size and geometry, and also in the impurity concentration.

Width W31 of the diffusion layers 14a, 14b is smaller than the width W21 of the diffusion layer 7 in the previous embodiment, and the diffusion layers 14a, 14b are disposed as being spaced by a predetermined distance. The diffusion layers 14a, 14b in this embodiment have a geometry such as deleting the center portion of the diffusion layer 7 in the previous embodiment.

Similarly to as in the previous embodiment, the diffusion layers 14a, 14b are formed in the non-conductive region T (not shown in FIG. 12). The diffusion layers 14a, 14b are not formed in a region except the non-conductive region T.

In thus-configured semiconductor device 200, similarly to as in the previous embodiment, when the voltage (drain voltage) applied between the drain electrode 10 and the source electrode 9 increases, the depletion layer spreading due to the PN junction between the P-type base region 5 and the N-type drift region 2 reaches the depletion layer formed by the diffusion layers 14a, 14b and the drift region 2. The drain voltage VP in this state is 1 V. Moreover, the depletion layer formed by the diffusion layers 14a, 14b and the drift region 2 further expands, as the drain voltage increases.

Procedures for fabricating the semiconductor device 200 are same as those for the semiconductor device 100 of the previous embodiment, so that the explanations therefor will be omitted.

This embodiment configured as described in the above successfully raises the effects similar to those in the first embodiment, and also additional effects as described below.

For an exemplary case where a motor having an H bridge circuit is operated by the semiconductor device 200, voltage applied between the source and the drain instantaneously inverts, and current flows through a parasitic diode of the semiconductor device 200 (PN junction formed between the P-type base region 5 and the N-type drift region 2 shown in FIG. 12). The current flows from the base area 5A towards the drift region 2 below the base area 5A.

The previous embodiment has been suffered from increase in voltage drop because the flow of current from the base region 5 towards the drift region 2 is inhibited by the diffusion layer 7, whereas in this embodiment, the flow of current directed from the base region 5 towards the drift region 2 is less likely to be inhibited because the diffusion layers 14a, 14b are disposed as being spaced from each other, and because the diffusion layers 14a, 14b are small in the width W31, so that the voltage drop can be reduced to a level not so inferior to that of the conventional semiconductor device 500 having no diffusion layer formed therein.

The embodiments of the present invention have been described in the above, merely as exemplary cases of the present invention, allowing adoption of any other various configurations.

For example, the diffusion layers 7, 14a, 14b in the above-described embodiments were formed after the base region 5 and the source region 6 were formed, but the diffusion layers may be formed after the base region 5 is formed.

The voltage VP, set to 1 V in the above-described embodiments, may appropriately be set without being limited to the value in the above.

The diffusion layers 7, 14a, 14b in the above-described embodiments were formed right under all base areas 5A, but the diffusion layers are not always necessarily formed under all of the base areas 5A, allowing some of the base areas having no diffusion layer formed thereunder.

The trench 15 of the semiconductor devices 100, 200 in the above-described embodiments were configured as having the longitudinal trenches 151 and the transverse trenches 152, whereas the longitudinal-trenches-only is also allowable. For the case of the longitudinal-trenches-only, the longitudinal trenches and the base areas are alternately disposed. In other words, the base areas are disposed with a stripe pattern.

The planar geometry of the base area partitioned by the trench was rectangular in the plan view, but may be hexagonal in the plan view.

It is apparent that the present invention is not limited to the above embodiments, that may be modified and changed without departing from the scope and spirit of the invention.

What is claimed is:

1. A semiconductor device comprising:
a first-conductivity-type drift region;
a second-conductivity-type base region formed on a surficial portion of said drift region;
a gate electrode disposed in a trench wherein the trench extends over a surface of said base region, and penetrates said base region to reach said drift region; and
a first-conductivity-type source region formed in said base region,
said base region including a base area partitioned by said trench, and
said drift region having a second-conductivity-type diffusion layer formed therein, as being disposed apart from said base region, wherein
in a section taken in one direction normal to a direction of extension of said trench,
said base area is surrounded by said trench, and
said diffusion layer is not formed in a region except another region partitioned by
a pair of lines and a bottom line of said base; and the pair of lines each extending from each of intersections of the bottom line, and side faces of said trench surrounding said base area, towards a bottom plane of said drift region right under said base area, inclined at 50° away from said bottom line.

2. The semiconductor device as claimed in claim 1, wherein a voltage of 1 V or larger is applied between said base region and said drift region so that a depletion layer, which formed by said base region and said drift region, reaches to another depletion layer formed by said diffusion layer and said drift region.

3. The semiconductor device as claimed in claim 1, wherein
another diffusion layer is not formed in adjacent region except another adjacent region partitioned by other pair of lines and another bottom line of another base region; and the other pair of lines each extending from each of other intersections of the another bottom line, and other side faces of another trench surrounding said another base area, toward the bottom plane of said drift region right under said another base area, inclined at 50° away from said another bottom line.

* * * * *